United States Patent
Ota et al.

(10) Patent No.: US 10,448,497 B2
(45) Date of Patent: Oct. 15, 2019

(54) CIRCUIT ASSEMBLY AND ELECTRICAL JUNCTION BOX

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Takuya Ota, Mie (JP); Shigeki Yamane, Mie (JP); Hirotoshi Maeda, Mie (JP); Toshiyuki Tsuchida, Mie (JP); Yoshihiro Tozawa, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi, Osaka (JP)

( * ) Notice: Subject to any disclaimer, the term of this patent is extended or adjusted under 35 U.S.C. 154(b) by 0 days.

(21) Appl. No.: 15/758,926

(22) PCT Filed: Sep. 6, 2016

(86) PCT No.: PCT/JP2016/076088
§ 371 (c)(1),
(2) Date: Mar. 9, 2018

(87) PCT Pub. No.: WO2017/043462
PCT Pub. Date: Mar. 16, 2017

(65) Prior Publication Data
US 2019/0045618 A1 Feb. 7, 2019

(30) Foreign Application Priority Data
Sep. 11, 2015 (JP) .................. 2015-179420

(51) Int. Cl.
*H05K 1/02* (2006.01)
*H05K 7/20* (2006.01)
(Continued)

(52) U.S. Cl.
CPC ......... *H05K 1/0204* (2013.01); *H05K 1/0271* (2013.01); *H05K 1/181* (2013.01);
(Continued)

(58) Field of Classification Search
CPC .... H05K 1/0204; H05K 1/0271; H05K 1/181; H05K 7/1427; H05K 7/209;
(Continued)

(56) References Cited

U.S. PATENT DOCUMENTS 5,835,352 A * 11/1998 Matsuzaki ............ H01L 23/36
361/707
5,902,138 A * 5/1999 Murakami ........... H01R 9/2466
439/76.2

(Continued)

FOREIGN PATENT DOCUMENTS

| JP | H03255690 A | 11/1991 |
| JP | 2005-268648 A | 9/2005 |
| JP | 2015-082960 A | 4/2015 |

OTHER PUBLICATIONS

Search Report for PCT/JP2016/076088, dated Oct. 11, 2016.

*Primary Examiner* — Anthony M Haughton
*Assistant Examiner* — Yahya Ahmad
(74) *Attorney, Agent, or Firm* — Honigman LLP

(57) ABSTRACT

A circuit assembly includes a circuit board on which a coil is mounted, a heat sink, and a heat spreading plate that is separate from this heat sink. A first insulating adhesive layer is interposed between the circuit board and the heat spreading plate, and the heat spreading plate and the heat sink are fixed by a first fixing hole for a heat sink and a bolt. Accordingly, warping of the circuit board is suppressed.

10 Claims, 15 Drawing Sheets

(51) Int. Cl.
*H05K 1/18* (2006.01)
*H05K 7/14* (2006.01)

(52) U.S. Cl.
CPC ........... *H05K 7/1427* (2013.01); *H05K 7/209* (2013.01); *H05K 2201/066* (2013.01); *H05K 2201/068* (2013.01); *H05K 2201/1009* (2013.01); *H05K 2201/10113* (2013.01)

(58) Field of Classification Search
CPC ... H05K 2201/10113; H05K 2201/066; H05K 2201/068; H05K 2201/1009
See application file for complete search history.

(56) References Cited

U.S. PATENT DOCUMENTS

| | | | | |
|---|---|---|---|---|
| 6,121,548 A | * | 9/2000 | Matsuoka | B60R 16/0239 174/59 |
| 6,494,723 B2 | * | 12/2002 | Yamane | B60R 16/0238 439/404 |
| 7,154,753 B2 | * | 12/2006 | Kobayashi | H05K 1/0203 361/715 |
| 7,553,169 B2 | * | 6/2009 | Kasai | H05K 1/0263 439/76.2 |
| 7,632,110 B2 | * | 12/2009 | Kanou | B60R 16/0239 361/704 |
| 7,950,931 B2 | * | 5/2011 | Nakanishi | H02G 3/088 439/76.2 |
| 2004/0160754 A1 | * | 8/2004 | Kobayashi | H05K 1/0203 361/783 |
| 2006/0067058 A1 | * | 3/2006 | Kita | B60R 16/0239 361/710 |
| 2006/0187643 A1 | * | 8/2006 | Tsurufusa | H05K 7/2049 361/704 |
| 2008/0247139 A1 | * | 10/2008 | Stahlhut | H05K 1/0203 361/709 |
| 2011/0194255 A1 | * | 8/2011 | Yamashita | B23K 1/0016 361/711 |
| 2013/0003306 A1 | * | 1/2013 | Oota | B60R 16/0239 361/709 |
| 2017/0079129 A1 | * | 3/2017 | Chin | H05K 1/0204 |

* cited by examiner

CIRCUIT ASSEMBLY AND ELECTRICAL JUNCTION BOX

CROSS-REFERENCE TO RELATED APPLICATIONS

This application is the U.S. national stage of PCT/JP2016/076088 filed Sep. 6, 2016, which claims priority of Japanese Patent Application No. JP 2015-179420 filed Sep. 11, 2015.

TECHNICAL FIELD

The technology disclosed in this specification relates to a circuit assembly and an electrical junction box.

BACKGROUND

Conventionally known is an electrical junction box in which a circuit assembly with electronic components mounted in a conductive path of a circuit board is accommodated in a case (see JP 2003-164039A). The electronic components generate heat during their activation, and thus a heat dissipation plate is attached to the circuit assembly. Heat generated in the electronic components is dissipated by this heat dissipation plate.

If an electronic component is mounted on a relatively thin circuit board for example, there is a concern that the circuit board will warp.

The technology disclosed in this specification is based on the above-described circumstances, and its object is to provide a circuit assembly or an electrical junction box in which warping of the circuit board is suppressed.

SUMMARY

The technology disclosed in this specification relates to a circuit assembly including a circuit board on which an electronic component is mounted, a heat dissipation plate, and a heat spreading plate that is separate from the heat dissipation plate. An insulating adhesive layer is interposed between the circuit board and the heat spreading plate, and the heat spreading plate and the heat dissipation plate are fixed to each other by fixing means.

Also, the technology disclosed in this specification relates to an electrical junction box in which the above-described circuit assembly is accommodated in a case.

According to the technology disclosed in this specification, heat generated in an electronic component during its activation is transmitted to the circuit board, and transmitted to the heat spreading plate via the adhesive layer. Heat transmitted to the heat spreading plate is uniformized due to distribution in the heat spreading plate. This suppresses an increase in the temperature of the vicinity of the electronic component. Furthermore, heat transmitted to the heat spreading plate is transmitted to the heat dissipation plate fixed to each other by fixing means and dissipated from the heat dissipation plate. Accordingly, it is possible to increase the overall heat dissipation of the circuit assembly or the electrical junction box.

Also, according to the technology disclosed in this specification, the heat spreading plate is placed on the circuit board via the adhesive layer. Accordingly, the circuit board is reinforced by the heat spreading plate, suppressing warping of the circuit board. As a result, for example, formation of defects in a portion at which the conductive path of the circuit board and the electronic component are connected is suppressed. Accordingly, it is possible to stably produce circuit assemblies or electrical junction boxes, and thus to increase the efficiency of manufacturing circuit assemblies or electrical junction boxes.

The following aspects are preferable as an embodiment of the present invention.

The heat dissipation plate is preferably provided with a positioning portion for positioning the heat spreading plate.

According to this aspect, when the heat spreading plate and the heat dissipation plate are fixed, the heat spreading plate can be easily positioned with respect to the heat dissipation plate. Accordingly, it is possible to increase the efficiency of manufacturing the circuit assemblies or the electrical junction boxes.

Also, according to this aspect, the heat spreading plate and the heat dissipation plate are fixed in a state in which they are positioned, and thus it is possible to reliably fix a relative arrangement of the heat spreading plate and the heat dissipation plate. As a result, it is possible to reliably form a heat transmission path extending from the heat spreading plate to the heat dissipation plate, and thus to increase the heat dissipation of the circuit assembly or the electrical junction box.

The heat spreading plate is preferably fixed to the heat dissipation plate in a state in which the heat spreading plate is pressed against the heat dissipation plate.

According to this aspect, since the heat spreading plate is fixed to the heat dissipation plate in a state in which the heat spreading plate is pressed against the heat dissipation plate, it is possible to reliably bring the heat spreading plate and the heat dissipation plate into contact with each other. As a result, it is possible to increase the efficiency of heat transmission from the heat spreading plate to the heat dissipation plate, and thus to increase the heat dissipation of the circuit assembly or the electrical junction box.

The circuit board and the heat spreading plate are preferably fixed to the heat dissipation plate in a state in which the circuit board and the heat spreading plate are pressed against the heat dissipation plate.

According to this aspect, heat generated in the circuit board is also transmitted from the heat spreading plate to the heat dissipation plate. As a result, it is possible to increase the heat dissipation of the circuit assembly.

The adhesive layer is preferably made of a thermally conductive material.

According to this aspect, it is possible to increase the efficiency of heat transmission from the circuit board to the heat spreading plate, and thus to further increase the heat dissipation of the circuit assembly or the electrical junction box.

A configuration may also be adopted in which the electronic component has a lead terminal, the lead terminal is mounted passing through the circuit board, a lead terminal escape hole is provided in a region of the heat spreading plate that corresponds to at least the lead terminal.

According to this aspect, an electronic component is disposed on the circuit board in a state in which the circuit board is reinforced by the heat spreading plate. As a result, when the electronic component is disposed on a placement surface of the circuit board, defects such as warping of the circuit board are suppressed. Accordingly, it is possible to increase the efficiency of manufacturing the circuit assemblies or the electrical junction boxes.

If a relatively large electric current flows through the circuit board, it is preferable that the lead terminal of the electronic component is mounted on the circuit board in a state in which the lead terminal passes through the circuit board. This is because if the circuit board is obtained by stacking a plurality of circuit boards, for example, conductive paths of the stacked circuit boards can be utilized. In this case, the lead terminal passes through the circuit board, and thus there is a concern that the tip of the lead terminal will interfere with the heat spreading plate. According to this aspect, the heat spreading plate is provided with a connection hole in a region corresponding to the lead terminal, and thus interference of the lead terminal of the electronic component with the heat spreading plate is avoided. As a result, it is possible to increase the electric current that is supplied to the circuit assembly or the electrical junction box.

Note that the connection hole may also be a through-hole that passes through the circuit board, or a closed-end hole that does not pass through the circuit board and has a bottom portion.

It is preferable that the lead terminal escape hole passes through the heat spreading plate, and the heat dissipation plate is provided with, in a region that is opposite to the lead terminal, an escape recess that is recessed away from the heat spreading plate.

According to this aspect, the lead terminal arranged in the lead terminal escape hole of the heat spreading plate is arranged in the escape recess formed at a position corresponding to the connection hole. Accordingly, if the heat spreading plate and the heat dissipation plate are in close contact with each other, interference of the tip of the lead terminal with the heat dissipation plate is avoided. As a result, the heat spreading plate and the heat dissipation plate can be brought into close contact with each other, and thus it is possible to increase the efficiency of heat transmission from the heat spreading plate to the heat dissipation plate. Accordingly, it is possible to further increase the heat dissipation of the circuit assembly or the electrical junction box.

It is preferable that the electronic component is a surface-mount type component.

When the electronic component is mounted on the surface of the circuit board, the circuit board is heated in a reflow furnace in a state in which the electronic component is placed on the circuit board. Then, there is a concern that a stress is applied to the circuit board. According to this aspect, the heat spreading plate is placed on the circuit board, and thus even through a stress is applied to the circuit board by heating in the reflow furnace, this stress is received by the heat spreading plate. Accordingly, warping of the circuit board is suppressed. As a result, it is possible to further increase the efficiency of manufacturing the circuit assemblies or the electrical junction boxes.

ADVANTAGEOUS EFFECTS OF INVENTION

According to the technology disclosed in this specification, warping of a circuit board can be suppressed.

DETAILED DESCRIPTION OF PREFERRED EMBODIMENTS

Embodiment 1

Embodiment 1 will be described with reference to FIGS. 1 to 15. An electrical junction box 10 according to the present embodiment is arranged between a power source such as a battery, and an onboard electrical component such as a lamp or a motor. In the following description, "top" or "upper" refers to the upper side of FIG. 1, and "back" or "lower" refers to the lower side of FIG. 1.

Electrical Junction Box 10

Figure 1:
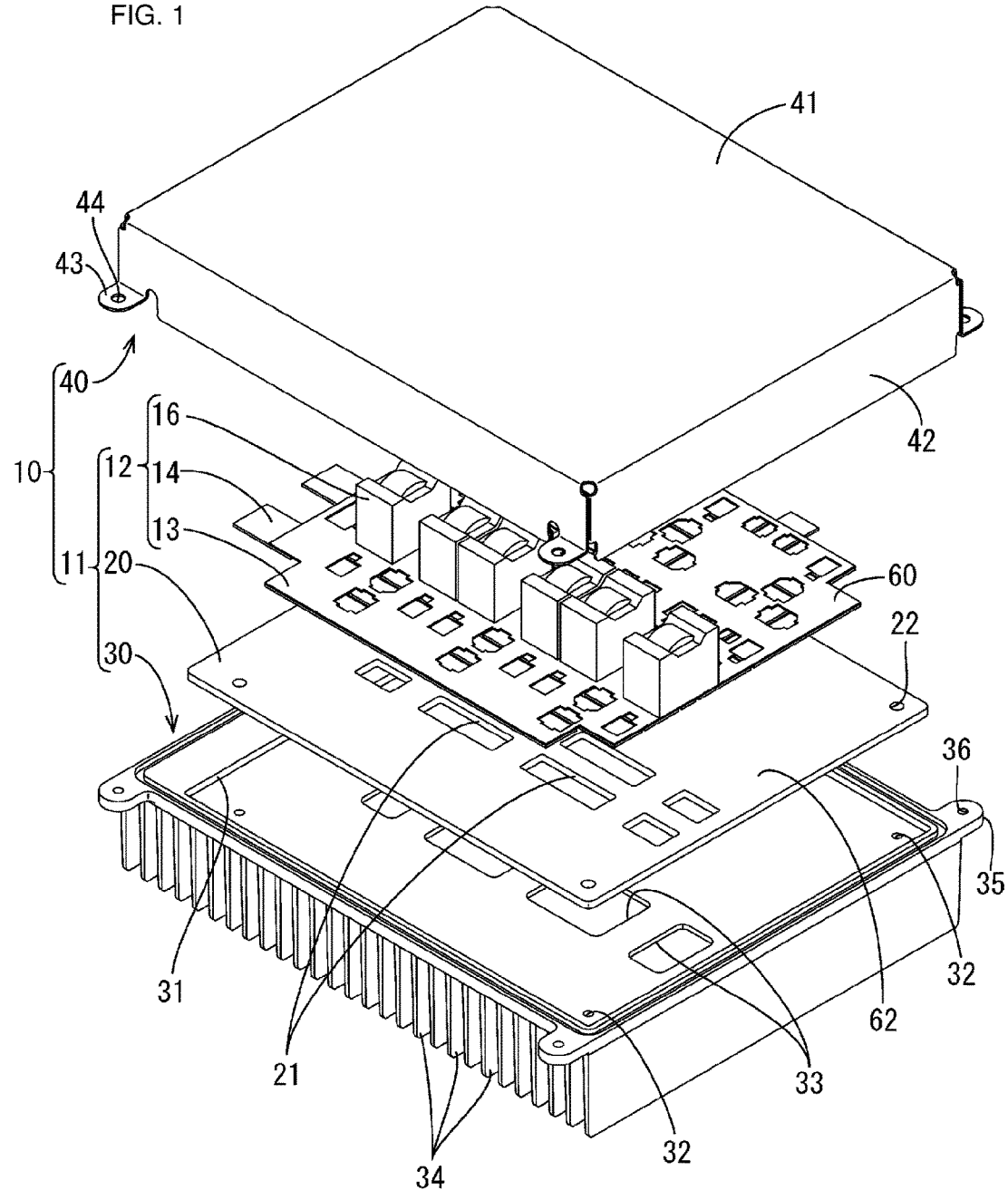
FIG. 1 is an exploded perspective view of an electrical junction box according to Embodiment 1.

As shown in FIG. 1, the electrical junction box 10 includes a circuit assembly 11 and a shield cover 40. The circuit assembly 11 includes a circuit board 12, a heat spreading plate (heat spreader) 20 arranged on the back side (a lower surface in FIG. 1) of the circuit board 12, and a heat sink 30 (case, heat dissipation plate) arranged on the back side of the heat spreading plate 20. The shield cover 40 (case) covers this circuit assembly 11 from the top.

Circuit Board 12

The circuit board 12 has a placement surface 60 on which coils 16 (electronic components) are mounted, and an adhering surface 61 that is located opposite to the placement surface 60 and is provided with a first insulating adhesive layer 19 (adhesive layer). Note that in addition to the coils 16, any electronic components such as a FET, a capacitor, and a resistor can be disposed on the placement surface 60 of the circuit board 12 as appropriate.

The circuit board 12 includes a printed wiring board 13 provided with a conductive path (not shown) that is formed on the surface of an insulation board by printed wiring, and busbars 14 (conductive paths) that are adhered to the back side of the printed wiring board 13 via a second insulating adhesive layer 70. The busbars 14 are formed by pressing a metal plate into a predetermined shape. Any metal such as copper, a copper alloy, aluminum, or an aluminum alloy can be used as appropriate as the metal for forming the busbars 14.

Note that the second adhesive layer 70 that adheres the printed wiring board 13 to the busbars 14 may also be an insulating adhesive sheet or a sheet obtained by applying an insulating adhesive thereto and then curing the adhesive. A thermosetting adhesive may also be selected as the adhesive or any adhesive can be selected as needed. The second adhesive layer 70 is made of a thermally conductive material.

Figure 2:
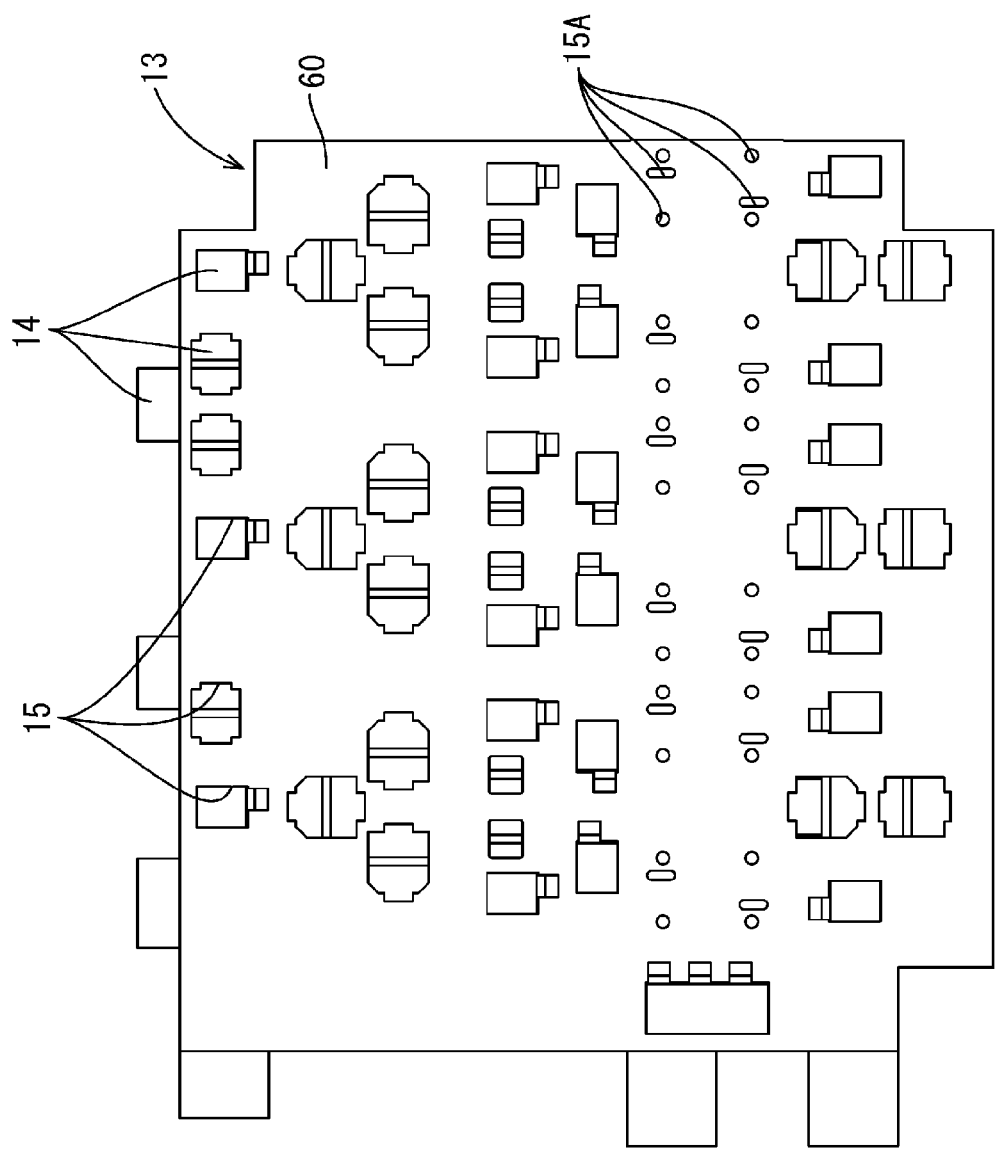
FIG. 2 is a plan view of a circuit board before an electronic component is mounted.
Figure 3:
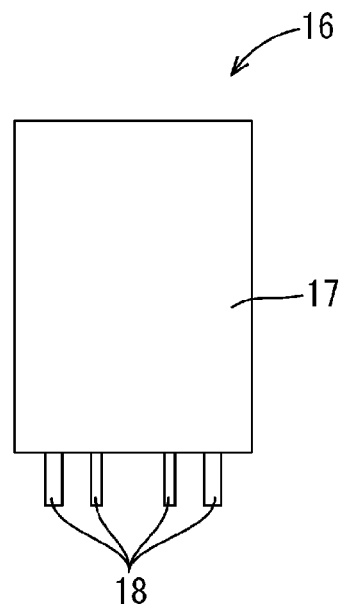
FIG. 3 is a front view of a coil.
Figure 4:
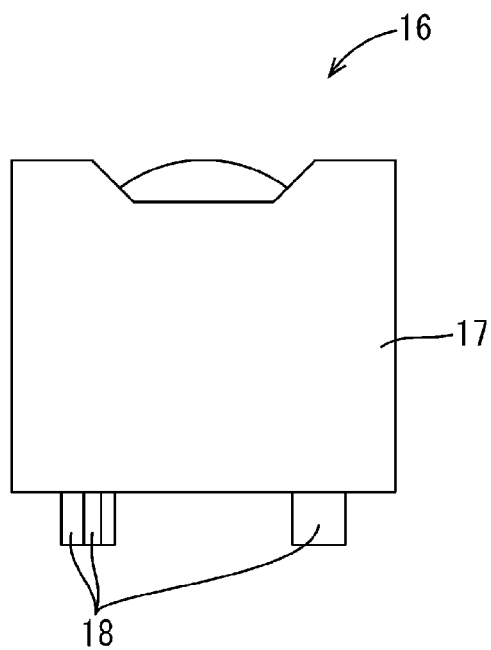
FIG. 4 is a side view of the coil.
Figure 5:
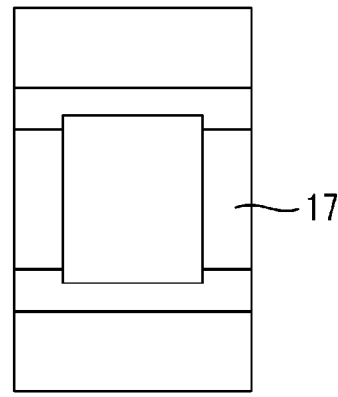
FIG. 5 is a plan view of the coil.
Figure 6:
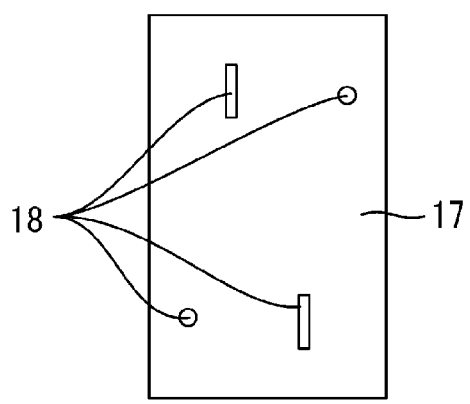
FIG. 6 is a bottom view of the coil.

As shown in FIG. 2, the printed wiring board 13 is substantially rectangular with, at three of its four corners, cutout portions that are cut out in a rectangular shape, and is provided with a plurality of connection through holes 15 at predetermined positions. The surfaces of the busbars 14 are exposed from the connection through holes 15. Lead terminals 18 of the coils 16 are connected to the surfaces of the busbars 14 or the conductive path of the conductive circuit using a known method such as soldering, for example.

Note that in the present embodiment, only relatively large coils 16 are shown out of the plurality of electronic components, and illustration of other electronic components is omitted.

As shown in FIGS. 3 to 6, the coils 16 used in the present embodiment have a substantially cuboid main portion 17, and two pin-shaped lead terminals 18 and two flat plate-shaped lead terminals 18 that alternately protrude downward from the bottom of the main portion 17. In the present embodiment, six coils 16 (hereinafter, referred to as "coils 16A, 16B, 16C, 16D, 16E, and 16F" when they are individually described) are arranged on the printed wiring board 13 in a line (see FIGS. 11 and 12).

As shown in FIG. 2, the printed wiring board 13 is provided with, in the portions on which the coils 16 are disposed, a plurality of coil connection through holes 15A through which the lead terminals 18 of the coils 16 are passed. Similarly, the busbars 14 are provided with, at positions that overlap with the coil connection through holes 15A, busbar-side through holes (not shown) through which the lead terminals 18 of the coils 16 are passed. The lead terminals 18 are inserted into the busbar-side through-holes and pass through the busbars 14.

The lead terminals 18 of the coils 16 are connected in a state in which the lead terminals 18 pass through the busbars 14, using a known method such as soldering, for example. Note that the lead terminals 18 may also be connected to the conductive path formed on the placement surface of the printed wiring board 13, using a known method such as soldering, for example.

Heat Spreading Plate 20

The heat spreading plate 20 is placed on the adhering surface 61 of the circuit board 12 via the first insulating adhesive layer 19. In other words, the heat spreading plate 20 is disposed on the lower surface of the busbars 14 arranged on the back side of the printed wiring board 13. The heat spreading plate 20 has an adhered surface 62 and a heat transmission surface 63. The adhering surface 61 of the circuit board 12 and the adhered surface 62 of the heat spreading plate 20 are placed on each other via the first adhesive layer 19.

The heat spreading plate 20 is a plate-shaped member that is made of aluminum or an aluminum alloy and has excellent thermal conductivity, and is configured to receive heat generated in the circuit board 12 when power is supplied thereto and distribute this heat throughout the entire heat spreading plate 20. Furthermore, the heat spreading plate 20 transmits heat to the heat sink 30, which will be described later. The heat spreading plate 20 has a rectangular shape that is slightly larger than the circuit board 12 (see FIG. 10).

Figure 7:
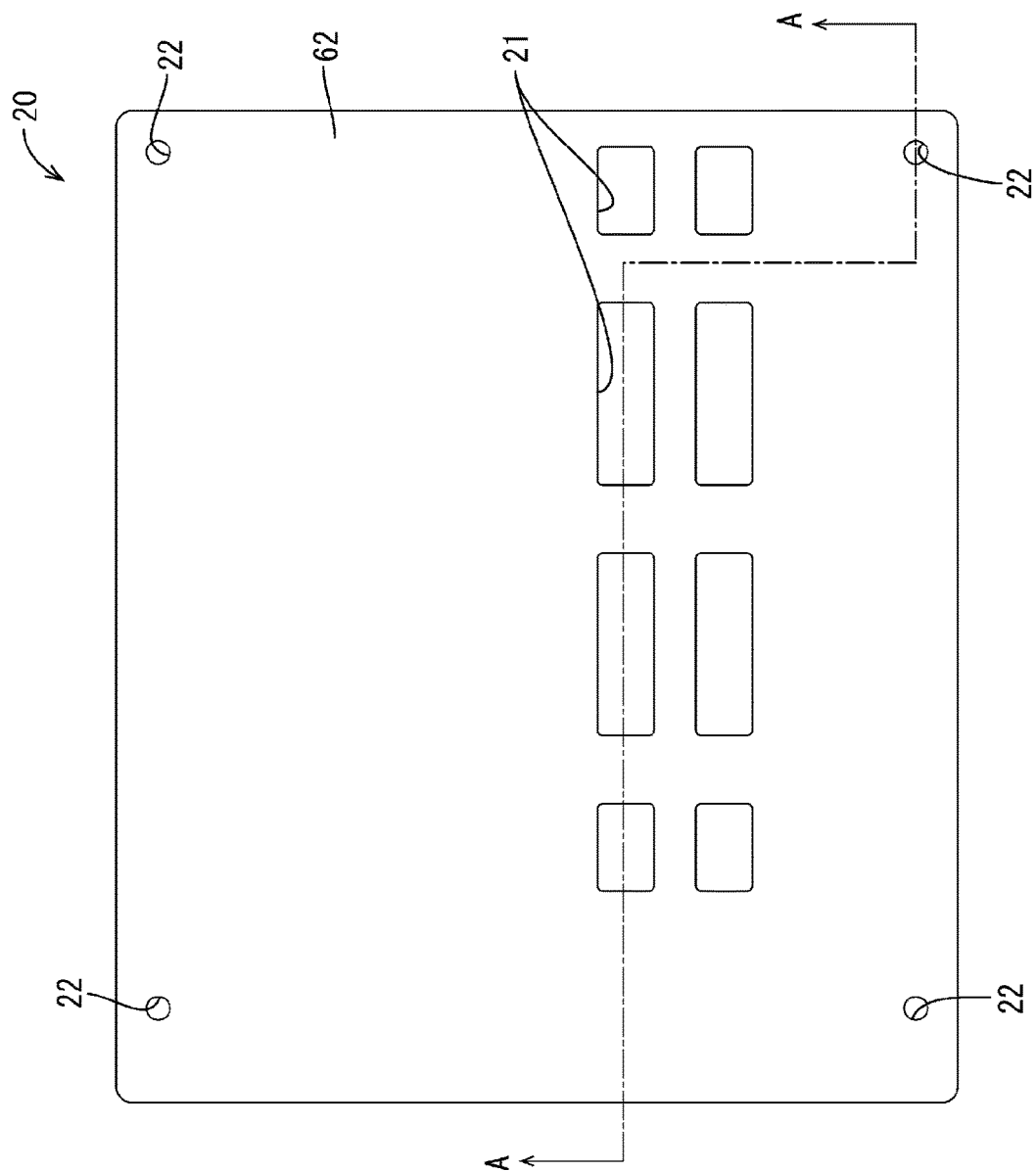
FIG. 7 is a plan view of a heat transmission plate.
Figure 8:
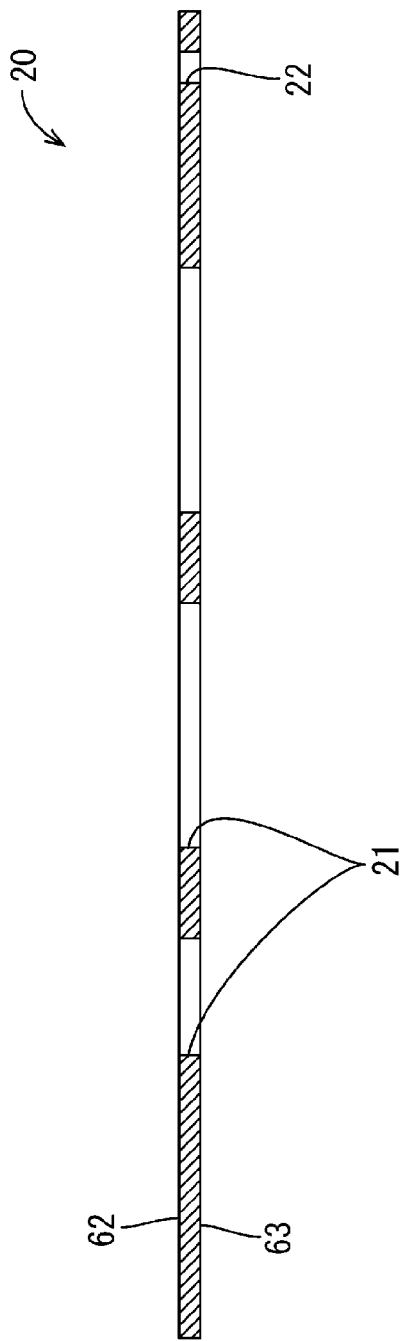
FIG. 8 is a cross-sectional view taken along a line A-A in FIG. 7.

As shown in FIGS. 7 and 8, lead terminal escape holes 21 (connection holes) are formed passing through regions of the heat spreading plate 20 that correspond to the lead terminals 18 of the coils 16 in a state in which the circuit board 12 is arranged. The lead terminal escape holes 21 have such a size that pairs of lead terminals 18 can pass through them together, the lead terminals 18 being lined up in the direction in which the short side of the bottom surface of the main portion 17 of one coil 16 extends.

Note that in the present embodiment, in six coils 16A, 16B, 16C, 16D, 16E, and 16F that are arranged in a line, two coils each (but not the two end coils), that is, the coils 16B and 16C, and the coils 16D and 16E are arranged close together with a slight gap on the printed wiring board 13, and thus the lead terminal escape holes 21 for these close coils 16B and 16C as well as 16D and 16E are not partitioned and the holes are each big enough for two coils.

The lead terminals 18 that pass through the circuit board 12 face the lead terminal escape hole 21.

Also, heat spreading plate fixing holes 22 for allowing bolts 50 (fixing means) that fix the heat spreading plate 20 to the heat sink 30 to pass through are provided near the four corners of the heat spreading plate 20.

The first adhesive layer 19 that adheres the circuit board 12 and the heat spreading plate 20 may also be an insulating adhesive sheet or a sheet obtained by applying an insulating adhesive to it and then curing the adhesive. A thermosetting adhesive may also be selected as the adhesive or any adhesive can be selected as needed. The first adhesive layer 19 is made of a thermally conductive material.

Heat Sink 30

A heat sink 30 that is separate from the heat spreading plate 20 is placed on a heat transmission surface 63 of the heat spreading plate 20. The heat sink 30 is a heat dissipation member made of metal such as, for example, aluminum or an aluminum alloy that is excellent in thermal conductivity, and has the function to dissipate heat generated in the circuit board 12.

Figure 9:
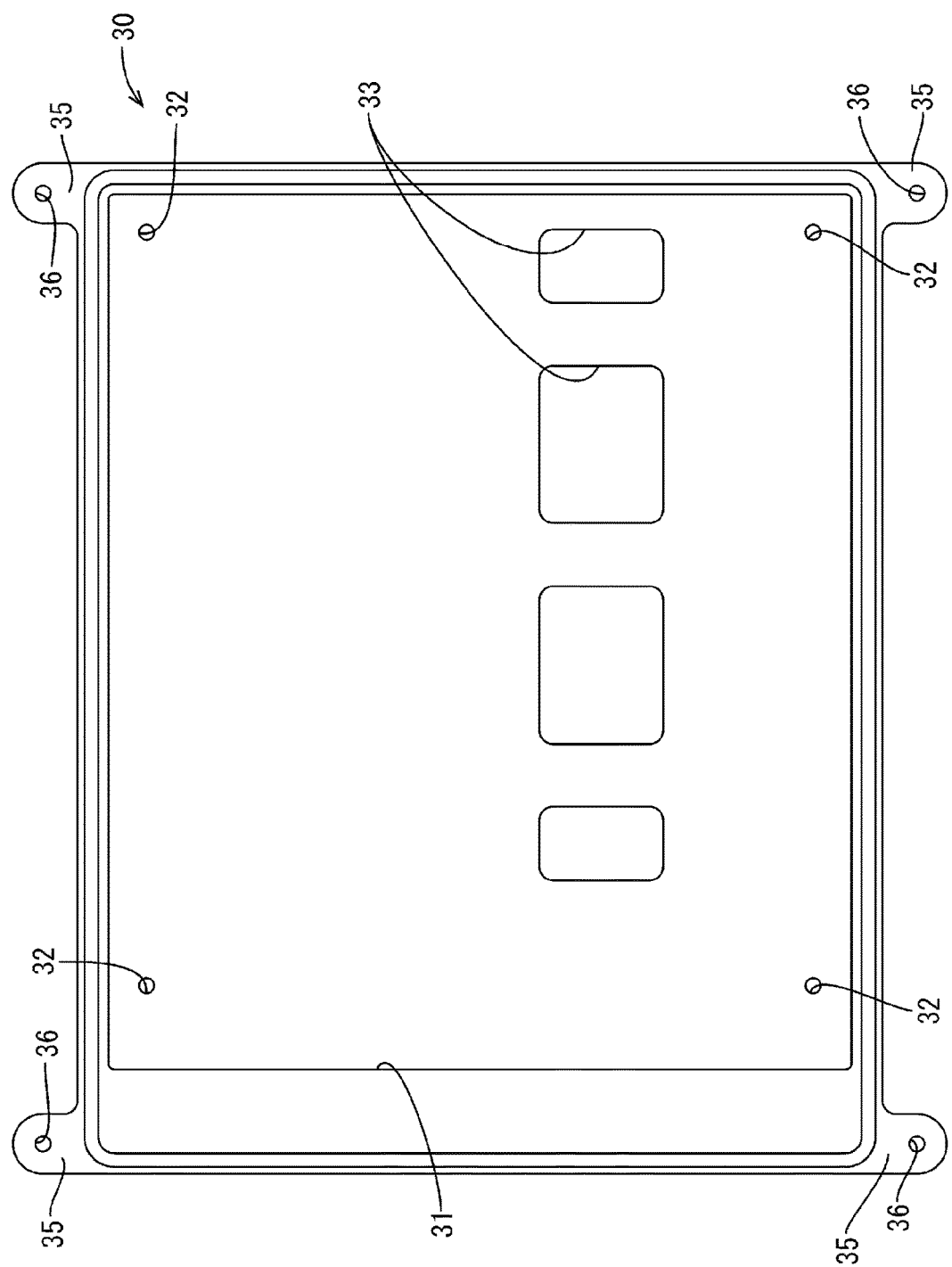
FIG. 9 is a plan view of a heat sink.
Figure 10:
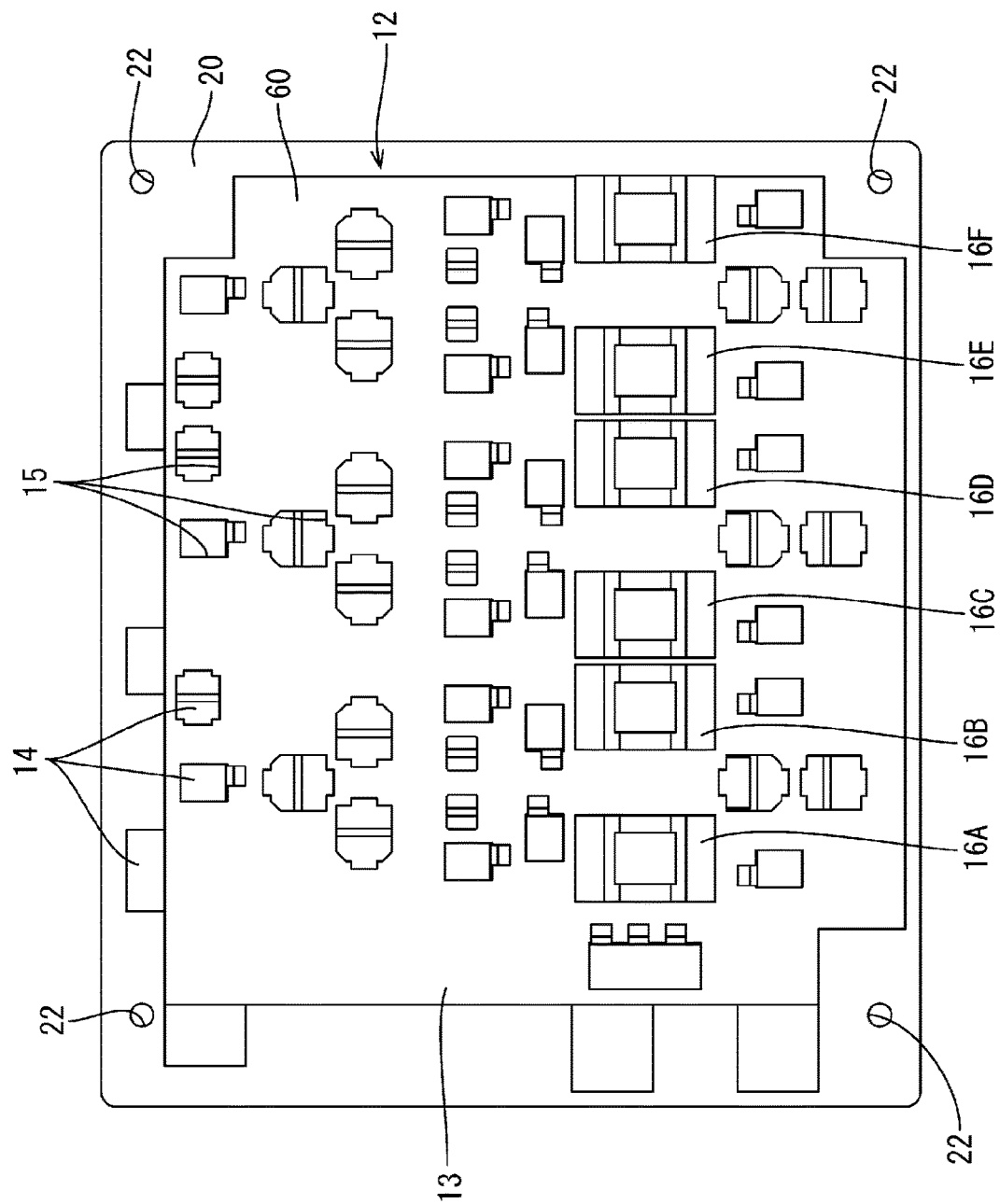
FIG. 10 is a plan view of a circuit board and a heat transmission plate.
Figure 11:
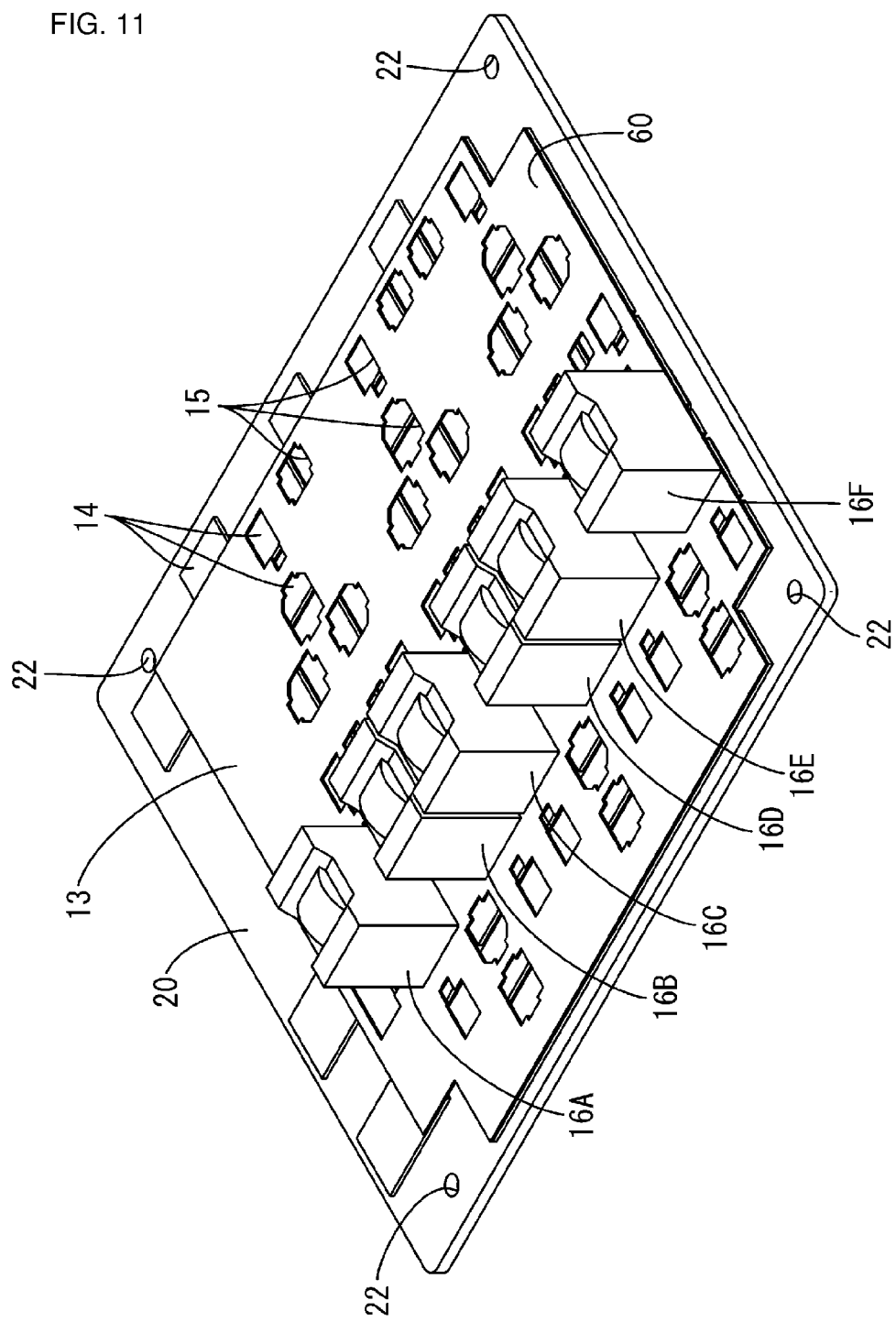
FIG. 11 is a perspective view of the circuit board and the heat transmission plate.
Figure 12:
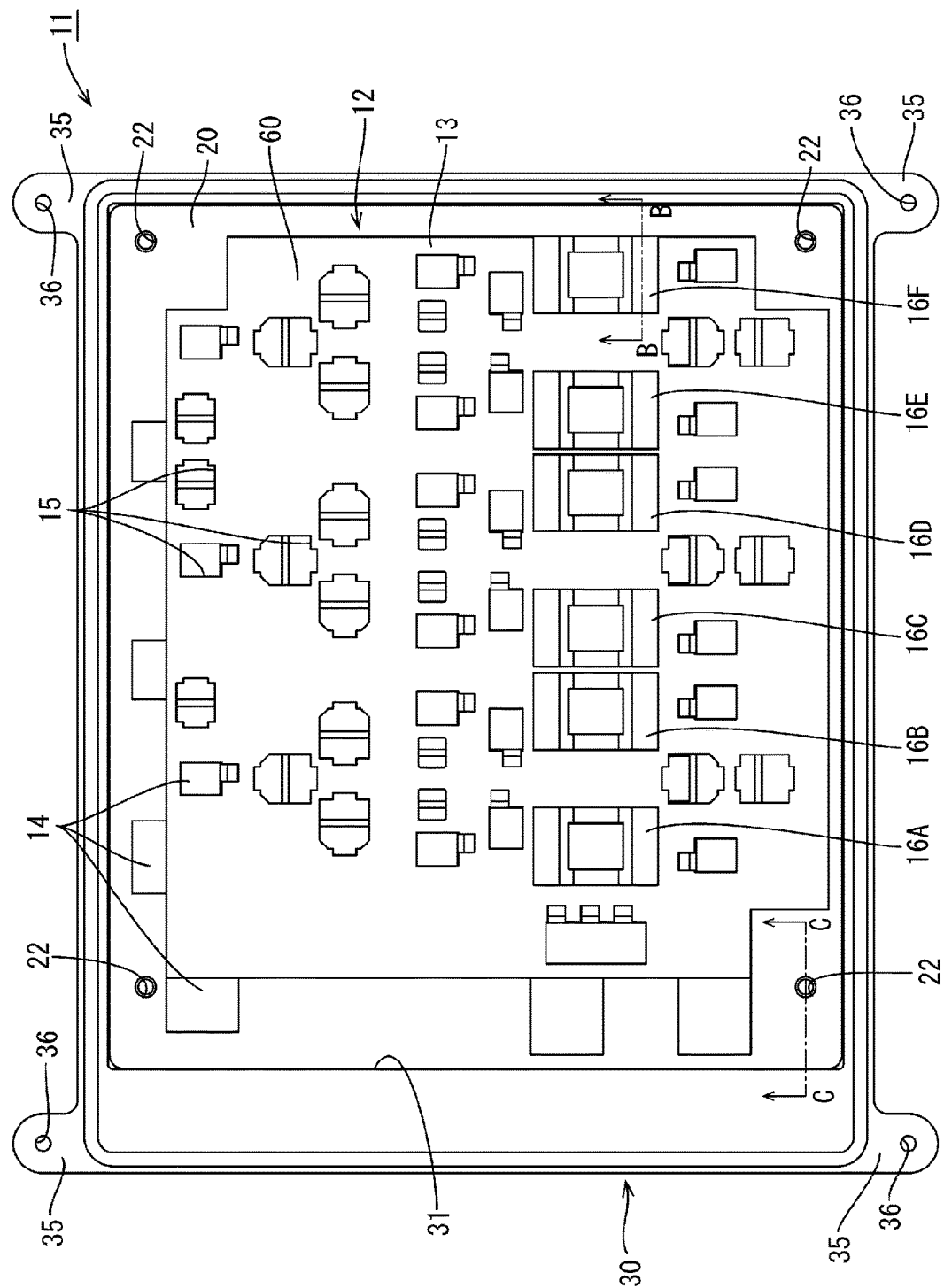
FIG. 12 is a plan view of a circuit assembly.

The upper surface of the heat sink 30 is flat plate shaped, and, at edges in the region in which the above-described heat spreading plate 20 is arranged, a positioning portion 31 into which the heat spreading plate 20 is fitted and that extends along the outer shape of the heat spreading plate 20 is recessed downward, as shown in FIG. 9. Also, first fixing holes 32 for a heat sink (one example of fixing means) are provided near the four corners of the positioning portion 31 at positions corresponding to the above-described heat spreading plate fixing holes 22 of the heat spreading plate 20. Although not shown in detail, the first fixing holes 32 for a heat sink are screw holes. The bolts 50 are screwed into the first fixing holes 32 for a heat sink, and thereby the heat spreading plate 20 is fixed to the heat sink 30 in a state in which the heat spreading plate 20 is pressed against the heat sink 30. The heat transmission surface 63 of the heat spreading plate 20 is thermally connected to the upper surface of the heat sink 30 via a thermally conductive adhesive, gel, sheet, or the like. The property of heat dissipation from the heat spreading plate 20 to the heat sink 30 is improved by clamping a thermally conductive material therebetween.

Also, escape recesses 33 are recessed downward in regions that are opposite to the above-described lead terminal escape holes 21 of the heat spreading plate 20. The escape recesses 33 have a substantially rectangular shape with such a size that all four lead terminals 18 of one coil 16 can be accommodated therein. That is, the above-described two lead terminal escape holes 21 face an opening of one escape recess 33. The size of the opening of the escape recess 33 may also be a size sufficient to completely accommodate two lead terminal escape holes 21, or be slightly smaller than the size sufficient to completely accommodate two lead terminal escape holes 21. Also, in the present embodiment, the escape recesses 33 for the coils 16B and 16C, and the coils 16D and 16E that are arranged close together are not partitioned and the escape recesses are each big enough for two coils.

Figure 13:
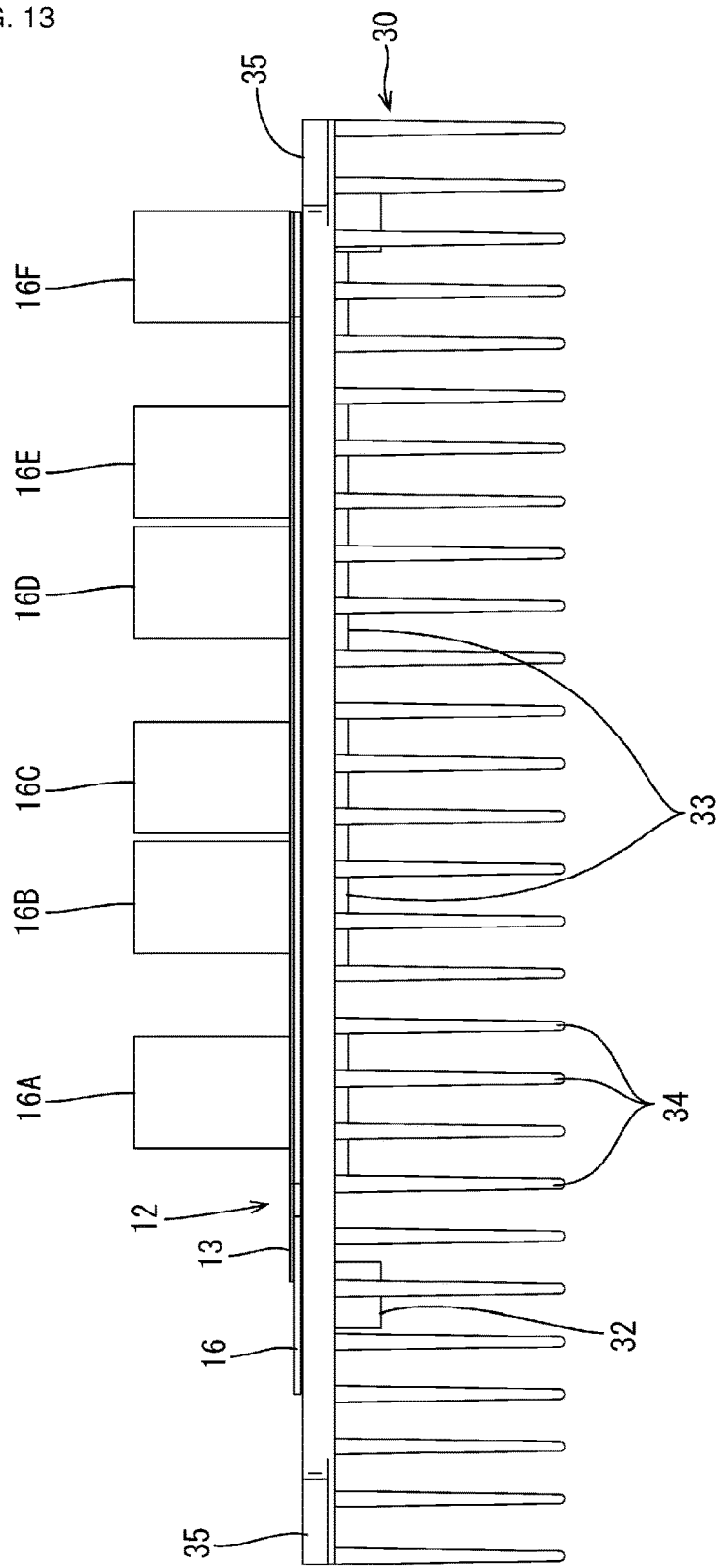
FIG. 13 is a side view of the circuit assembly.
Figure 14:
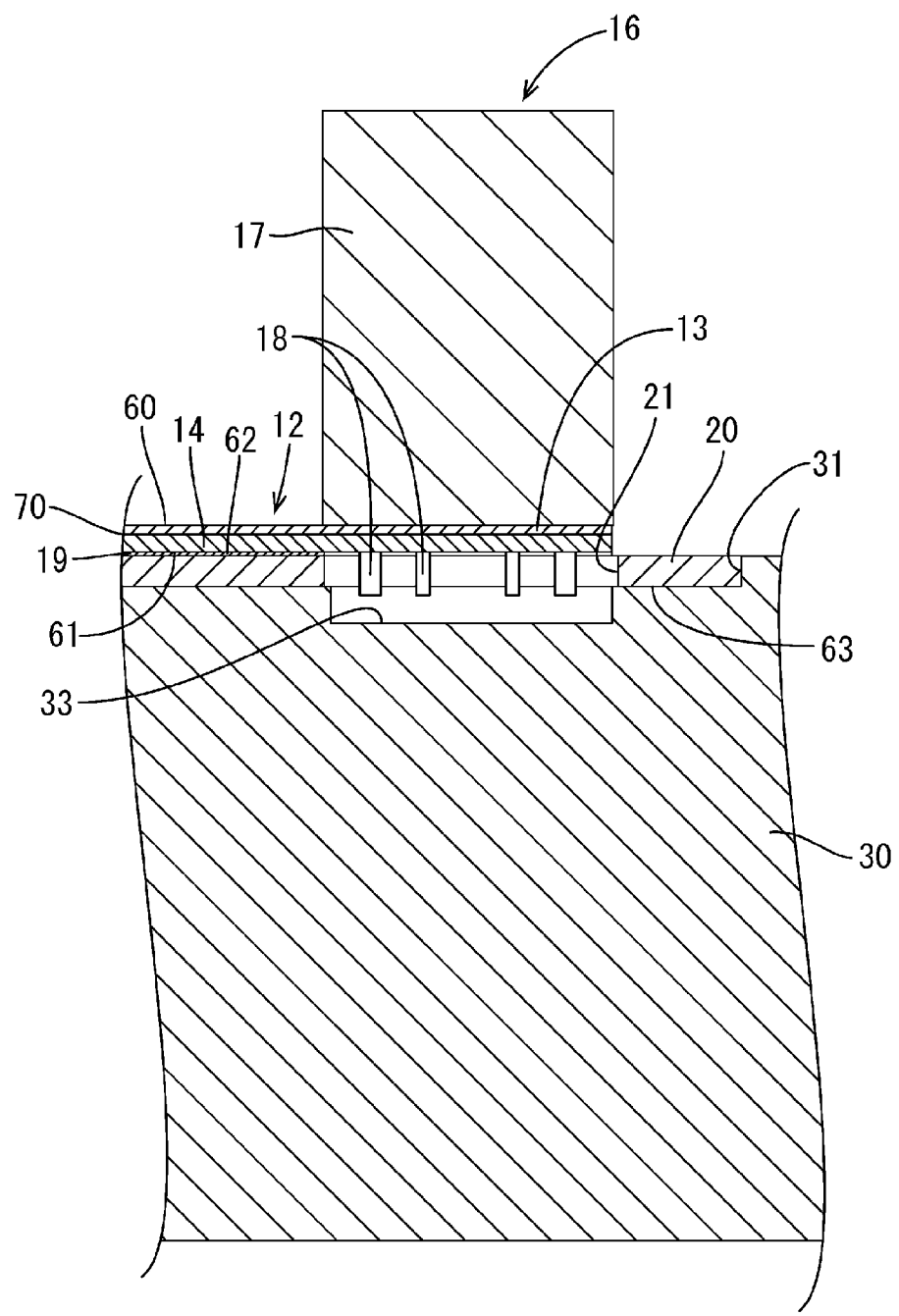
FIG. 14 is a cross-sectional view taken along a line B-B in FIG. 12.
Figure 15:
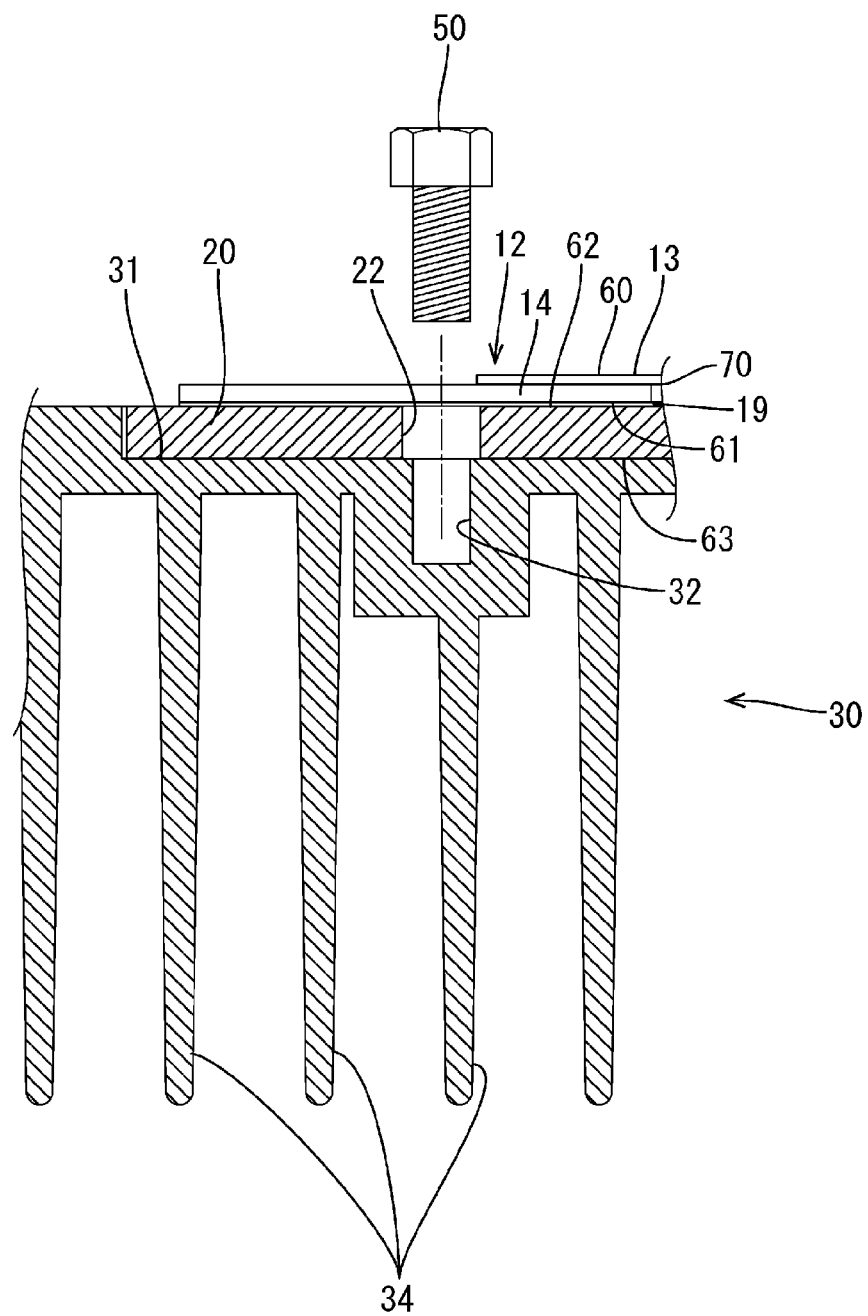
FIG. 15 is a cross-sectional view taken along a line C-C in FIG. 12.

Also, the lower surface of the heat sink 30 is provided with multiple plate-shaped fins 34 extending downward (see FIGS. 1 and 13).

Furthermore, both ends of long sides of the upper surface of the heat sink 30 are provided with heat sink extension portions 35 extending along a direction in which its short sides extend (the vertical direction in FIG. 9), and second fixing holes 36 for a heat sink for fixing the heat sink to a shield cover 40, which will be described later, pass through the heat sink extension portions 35.

Shield Cover 40

The upper portion of the circuit board 12 is covered by the shield cover 40 (see FIG. 1).

By stamping and bending a galvanized steel plate (made of metal), for example, the shield cover 40 has a substantially rectangular shallow dish shape, including a top plate 41 and four side walls 42 extending downward from edges of the top plate 41.

In the four side walls 42, both ends of a pair of side walls 42 extending in the long-side direction are provided with cover extension portions 43 extending from lower edges of the side walls 42 along a direction in which the short sides extend, and cover fixing holes 44 that overlap with the second fixing holes 36 for a heat sink pass through these cover extension portions 43.

These cover fixing holes 44 are placed on the second fixing holes 36 for a heat sink and bolts (not shown) are screwed thereto, and thereby the heat sink 30 and the shield cover 40 are electrically connected to each other and fixed together.

Effects of Embodiment

Next, the effects of the circuit assembly 11 and the electrical junction box 10 according to the present embodiment will be described.

According to the present embodiment, heat generated in the coils 16 when power is supplied is transmitted to the circuit board 12 and to the heat spreading plate 20 via the first adhesive layer 19. Heat transmitted to the heat spreading plate 20 is uniformized due to distribution in the heat spreading plate 20. Accordingly, an increase in the temperature of the vicinity of the coils 16 is suppressed.

Furthermore, heat that was transmitted to the heat spreading plate 20 is transmitted to the heat sink 30 fixed by the bolts 50 and the first fixing holes 32 for a heat sink, and dissipated from the heat sink 30. Accordingly, it is possible to increase the overall heat dissipation of the circuit assembly 11 and the electrical junction box 10.

Also, according to the present embodiment, the heat spreading plate 20 is placed on the circuit board 12 via the first adhesive layer 19. Accordingly, the circuit board 12 is reinforced by the heat spreading plate 20, suppressing warping of the circuit board 12.

Also, according to the present embodiment, the heat sink 30 is provided with the positioning portion 31 that positions the heat spreading plate 20. Accordingly, when the heat spreading plate 20 and the heat sink 30 are fixed, the heat spreading plate can be easily positioned with respect to the heat dissipation plate. As a result, it is possible to increase the efficiency of manufacturing the circuit assemblies 11 and the electrical junction boxes 10.

Also, according to the present embodiment, the heat spreading plate 20 and the heat sink 30 are fixed in a state in which they are positioned, and thus it is possible to reliably fix a relative arrangement of the heat spreading plate 20 and the heat sink 30. As a result, it is possible to reliably form a heat transmission path extending from the heat spreading plate 20 to the heat sink 30, and thus to increase the heat dissipation of the circuit assembly 11 and the electrical junction box 10.

Also, according to the present embodiment, the heat spreading plate 20 is fixed to the heat sink 30 in a state in which the heat spreading plate 20 is pressed against the heat sink 30. Accordingly, since the heat spreading plate 20 is fixed to the heat sink 30 in a state in which the heat spreading plate 20 is pressed against the heat sink 30, the heat spreading plate 20 and the heat sink 30 can be reliably brought into contact with each other. As a result, it is possible to increase the efficiency of heat transmission from the heat spreading plate 20 to the heat sink 30, and thus to increase the heat dissipation of the circuit assembly 11 and the electrical junction box 10.

Also, according to the present embodiment, the first adhesive layer 19 is made of a thermally conductive material. Accordingly, it is possible to increase the efficiency of heat transmission from the circuit board 12 to the heat spreading plate 20, and thus to further increase the heat dissipation of the circuit assembly 11 or the electrical junction box.

Also, according to the present embodiment, the coils 16 have the lead terminals 18, the lead terminals 18 are mounted passing though the circuit board 12, and the lead terminal escape holes 21 are provided in regions of the heat spreading plate 20 that are opposite to at least the lead terminals 18. Accordingly, the coils 16 are disposed on the circuit board 12 in a state in which the circuit board 12 is reinforced by the heat spreading plate 20. As a result, when the coils 16 are disposed on the placement surface 60 of the circuit board 12, defects such as warping of the circuit board 12 are suppressed. Accordingly, it is possible to increase the efficiency of manufacturing the circuit assemblies 11 or the electrical junction boxes 10.

If a relatively large electric current flows through the circuit board 12, it is preferable that the lead terminals 18 of the coils 16 are mounted on the circuit board 12 in a state in which the lead terminals 18 pass through the circuit board 12. This is because if the circuit board 12 is obtained by stacking a plurality of circuit boards, for example, the conductive paths of the respective stacked circuit boards can be utilized. In this case, the lead terminals 18 pass through the circuit board 12, and thus there is a concern that the tips of the lead terminals 18 will interfere with the heat spreading plate 20. According to the present embodiment, because the heat spreading plate 20 is provided with the lead terminal escape holes 21 in regions that are opposite to the lead terminals 18, interference of the lead terminals 18 of the coils 16 with the heat spreading plate 20 is avoided. As a result, it is possible to increase the electric current that is supplied to the circuit assembly 11 and the electrical junction box 10.

Also, according to the present embodiment, when the integrated circuit board 12 and heat spreading plate 20 can be easily fixed to the heat sink 30 by screwing bolts thereto. Because the heat spreading plate 20 is made of a material that is excellent in thermal conductivity, the circuit board 12 can be easily brought in thermal contact with the heat sink 30 via the heat spreading plate 20.

Embodiment 2

Figure 16:
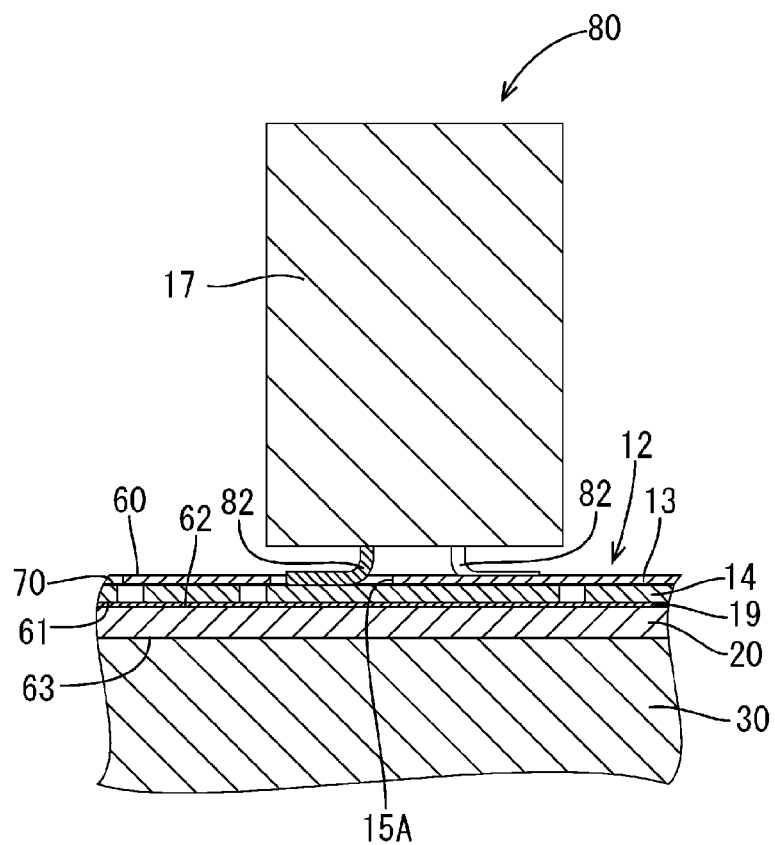
FIG. 16 is a cross-sectional view of an electrical junction box according to Embodiment 2.

Next, Embodiment 2 will be described with reference to FIG. 16. A plurality of lead terminals 82 (two in the present embodiment) of a coil 80 according to the present embodiment protrude downward from a bottom surface of a main portion 17. The lead terminals 82 have a plate shape, and are bent in an L-shape viewed from the side. Two lead terminals 82 are bent in opposite directions.

The lead terminals 82 are electrically connected to the surface of the busbar 14 by soldering. The lead terminals 82 can be connected to the busbars 14 by reflow soldering, for example.

No lead terminal escape holes 21 corresponding to the lead terminals 82 are formed in regions of the heat spreading plate 20 according to the present embodiment. Also, no escape recesses 33 are formed in a heat sink 30 according to the present embodiment.

The configurations other than the above are substantially the same as those of Embodiment 1, and thus the same members are given the same reference numerals and their redundant description will be omitted.

When the coils 80 are mounted on the surface of the circuit board 12, the circuit board 12 is heated in a reflow furnace (not shown) in a state in which the coils 80 are placed on the circuit board 12. At that time, there is a concern that a stress is applied to the circuit board 12. According to the present embodiment, the heat spreading plate 20 is placed on the circuit board 12, and thus even through a stress is applied to the circuit board 12 by heating in the reflow furnace, this stress is received by the heat spreading plate 20. Accordingly, warping of the circuit board 12 is suppressed. As a result, it is possible to further increase the efficiency of manufacturing the circuit assemblies 11 or the electrical junction boxes 10.

Embodiment 3

Figure 17:
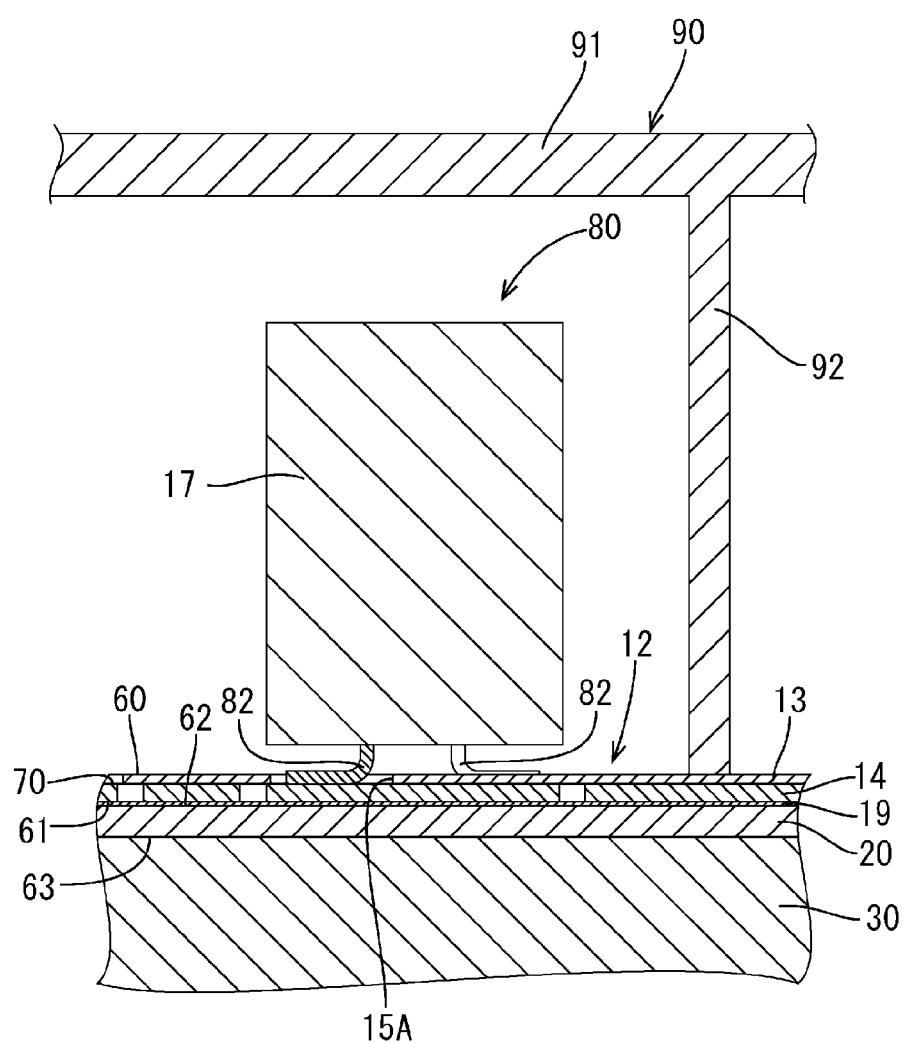
FIG. 17 is a cross-sectional view of an electrical junction box according to Embodiment 3.

Next, Embodiment 3 will be described with reference to FIG. 17. In the present embodiment, a pressing portion 92 is formed which extends toward a circuit board 12 from a lower surface of a cover 91 that constitutes a case 90 and presses a placement surface 60 of the circuit board 12 from above. The pressing portion 92 may also be integrally formed with the cover 91 or the pressing portion 92 that is formed separately from the cover 91 may also be configured to be fixed to the cover 91.

The circuit board 12 and the heat spreading plate 20 are pressed against the heat sink 30 by the circuit board 12 being pressed downward by the pressing portion 92. In this state, the circuit board 12 and the heat spreading plate 20 are fixed to the heat sink 30.

The configurations other than the above are substantially the same as those of Embodiment 2, and thus the same members are given the same reference numerals and their redundant description will be omitted.

According to the present embodiment, the circuit board 12 and the heat spreading plate 20 are fixed to the heat sink 30 in a state in which the circuit board 12 and the heat spreading plate 20 are pressed against the heat sink 30 by the case 90. Accordingly, heat generated in the circuit board 12 is also transmitted from the heat spreading plate 20 to the heat sink 30. As a result, it is possible to increase the heat dissipation of the circuit assembly 11.

OTHER EMBODIMENTS

The technology disclosed in this specification is not merely limited to the embodiments described above using the foregoing description and drawings, and embodiments such as the following are also encompassed in the technical scope of the present invention.

(1) Although the above-described embodiment has a configuration in which an adhesive insulating sheet is provided between the circuit board 12 and the heat spreading plate 20, a configuration may also be adopted in which an insulating adhesive is provided, for example.

(2) Although the above-described embodiment has a configuration in which the heat spreading plate 20 and the heat sink 30 are fixed to each other by the bolts 50, they may also be fixed by other fixing means other than the bolts 50, such as via fastening, clipping, or riveting. The heat spreading plate 20 and the heat sink 30 may also be fixed by an adhesive.

(3) Although in the present embodiment, the heat sink 30 is provided with the positioning portion 31 that is recessed, the present invention is not limited to this, and may also have a configuration in which the positioning portion protrudes from the heat sink. For example, a configuration may also be adopted in which a region surrounded by ribs that protrude upward from the upper surface of the heat sink is formed and the heat spreading plate 20 is fitted into this region. Furthermore, a configuration may also be adopted in which the heat sink both has positioning portions that are recessed from the heat sink and positioning portions that protrude from the heat sink.

(4) Although the lead terminal escape holes 21 are through-holes that pass through the heat spreading plate 20 in the present embodiment, the present invention is not limited to this, and a connection hole for a heat spreading plate may also be a closed-end hole having a bottom.

(5) Although the present embodiment has a configuration in which a thermal conductive material is interposed between the heat spreading plate 20 and the heat sink 30, the present invention is not limited to this and a configuration may also be adopted in which the heat spreading plate 20 and the heat sink 30 are in direct contact with each other.

The invention claimed is:

1. A circuit assembly comprising:
   a circuit board on which an electronic component is mounted;
   a heat dissipation plate; and
   a heat spreading plate that is separate from the heat dissipation plate,
   wherein an insulating adhesive layer is interposed between the circuit board and the heat spreading plate,
   the heat spreading plate and the heat dissipation plate are fixed to each other by fixing means, and
   the heat dissipation plate is provided with a positioning portion for positioning the heat spreading plate, the positioning portion being defined by an inner wall recessed from a top surface of the heat dissipation plate, wherein the inner wall bounds an outer peripheral edge of the heat spreading plate, the positioning portion seated within the inner wall of the positioning portion.

2. The circuit assembly according to claim 1, wherein the heat spreading plate is fixed to the heat dissipation plate in a state in which the heat spreading plate is pressed against the heat dissipation plate.

3. The circuit assembly according to claim 1, wherein the circuit board and the heat spreading plate are fixed to the heat dissipation plate in a state in which the circuit board and the heat spreading plate are pressed against the heat dissipation plate.

4. The circuit assembly according to claim 1, wherein the adhesive layer is made of a thermally conductive material.

5. The circuit assembly according to claim 1,
wherein the electronic component has a lead terminal,
the lead terminal is mounted passing through the circuit board, and
a lead terminal escape hole is provided in a region of the heat spreading plate that corresponds to at least the lead terminal.

6. The circuit assembly according to claim 5,
wherein the lead terminal escape hole passes through the heat spreading plate, and
the heat dissipation plate is provided with, in a region that is opposite to the lead terminal, an escape recess that is recessed away from the heat spreading plate.

7. The circuit assembly according to claim 1,
wherein the electronic component is a surface-mount type component.

8. An electrical junction box in which the circuit assembly according to claim 1 is accommodated in a case.

9. A circuit assembly comprising:
a circuit board on which an electronic component is mounted;
a heat dissipation plate having a recessed portion disposed on a top surface; and
a heat spreading plate that is separate from the heat dissipation plate,
wherein an insulating adhesive layer is interposed between the circuit board and the heat spreading plate,
the heat spreading plate and the heat dissipation plate are fixed to each other by fixing means, the heat spreading plate seated within the recessed portion of the heat dissipation plate,
the electronic component has a lead terminal,
the lead terminal is mounted passing through the circuit board, and
a lead terminal escape hole is provided in a region of the heat spreading plate that corresponds to at least the lead terminal, wherein a portion of the lead terminal is disposed within both the lead terminal escape hole and the recessed portion.

10. The circuit assembly according to claim 9,
the lead terminal escape hole passes through the heat spreading plate, and
the heat dissipation plate is provided with, in a region that is opposite to the lead terminal, an escape recess that is recessed away from the heat spreading plate.

* * * * *